United States Patent
Essaian et al.

(10) Patent No.: US 9,019,999 B2
(45) Date of Patent: Apr. 28, 2015

(54) EFFICIENT AND COMPACT VISIBLE MICROCHIP LASER SOURCE WITH PERIODICALLY POLED NONLINEAR MATERIALS

(75) Inventors: Stepan Essaian, San Jose, CA (US); Dzhakhangir Khaydarov, Campbell, CA (US); Andrei V. Shchegrov, Campbell, CA (US)

(73) Assignee: Spectralus Corporation, Santa Clara, CA (US)

( * ) Notice: Subject to any disclaimer, the term of this patent is extended or adjusted under 35 U.S.C. 154(b) by 422 days.

(21) Appl. No.: 13/394,286

(22) PCT Filed: Sep. 4, 2009

(86) PCT No.: PCT/US2009/056014
§ 371 (c)(1),
(2), (4) Date: Mar. 22, 2013

(87) PCT Pub. No.: WO2011/028207
PCT Pub. Date: Mar. 10, 2011

(65) Prior Publication Data
US 2013/0250983 A1 Sep. 26, 2013

(51) Int. Cl.
*H01S 3/10* (2006.01)
*H01S 5/06* (2006.01)
*H01S 3/0941* (2006.01)
*H01S 3/109* (2006.01)
*G02F 1/355* (2006.01)
*G02F 1/37* (2006.01)
(Continued)

(52) U.S. Cl.
CPC ............. *H01S 5/0605* (2013.01); *G02F 1/3558* (2013.01); *G02F 1/37* (2013.01); *G02F 2001/3503* (2013.01); *G02F 2202/20* (2013.01); *H01S 3/025* (2013.01); *H01S 3/0405* (2013.01); *H01S 3/0612* (2013.01); *H01S 3/0627* (2013.01); *H01S 3/09415* (2013.01); *H01S 3/109* (2013.01); *H01S 3/1611* (2013.01); *H01S 3/1673* (2013.01)

(58) Field of Classification Search
CPC ....... H01S 3/00; H01S 3/0014; H01S 3/0092; H01S 3/034; H01S 3/04; H01S 3/042; H01S 3/0602; H01S 3/0619; H01S 3/09; H01S 3/091; H01S 3/093; H01S 3/1611
USPC .................. 372/21–22, 49.01, 50.1
See application file for complete search history.

(56) References Cited

U.S. PATENT DOCUMENTS 7,742,510 B2 * 6/2010 Essaian et al. .................. 372/21
2007/0253453 A1 * 11/2007 Essaian et al. .................. 372/22

*Primary Examiner* — Dung Nguyen
(74) *Attorney, Agent, or Firm* — Gardner, Linn, Burkhart & Flory, LLP

(57) ABSTRACT

A compact, optically-pumped solid-state microchip laser device uses efficient nonlinear intracavity frequency conversion for obtaining low-cost green and blue laser sources. The laser includes a solid-state gain medium, such as Nd:YVO$_4$, and a nonlinear crystal. The nonlinear crystal is formed of periodically poled lithium niobate or periodically poled lithium tantalate, and the crystal is either MgO-doped, ZnO-doped, or stoichiometric to ensure high reliability. The nonlinear crystal provides efficient frequency doubling to translate energy from an infrared pump laser beam into the visible wavelength range. The laser device is assembled in a package having an output aperture for the output beam and being integrated with an optical bench accommodating a laser assembly. The package encloses and provides heat sinking for the semiconductor diode pump laser, the microchip laser cavity assembly, the optical bench platform, and electrical leads.

18 Claims, 6 Drawing Sheets

(51) Int. Cl.
*G02F 1/35* (2006.01)
*H01S 3/02* (2006.01)
*H01S 3/04* (2006.01)
*H01S 3/06* (2006.01)
*H01S 3/16* (2006.01)

EFFICIENT AND COMPACT VISIBLE MICROCHIP LASER SOURCE WITH PERIODICALLY POLED NONLINEAR MATERIALS

CROSS-REFERENCE TO RELATED APPLICATIONS

This application is the National Stage of International Application No. PCT/US2009/56014 filed Sep. 4, 2009.

FIELD OF THE INVENTION

The present invention is directed to a microchip visible laser source that includes use of periodically poled nonlinear materials.

BACKGROUND INFORMATION

Compact, efficient, and low-cost laser sources in the visible spectral range have long been desired for a variety of applications. These applications include laser-based projection displays, optical storage, bio-analytical instrumentation, semiconductor inspection and spectroscopy. Semiconductor lasers, which provide a low-cost, compact, and efficient platform, rely on material systems such as InGaAlP that lase most efficiently in the near-infrared spectral region. Efficient operation down to ~650 nm (red color) can be achieved without serious technological challenges and some semiconductor laser designs can be extended down to ~635 nm with however decreasing efficiency and reliability. On the shorter wavelength side of the visible region, GaN systems have been developed in recent years and lasers in the violet (~400 nm to ~445 nm) spectral range have been commercialized. However, achieving wavelengths >460 nm in an efficient and reliable way represents a serious challenge. Thus, the majority of the visible spectrum (i.e., from ~460 nm blue to ~635 nm red) does not currently have an efficient semiconductor laser solution.

Of these colors (wavelengths), the absence of green is perhaps the most notable since this color corresponds to the peak sensitivity of the human eye. Indeed, no direct solution for a green semiconductor laser is currently commercially available. The indirect solution, commercialized since the 1990s, has been based on nonlinear frequency doubling (also known as second-harmonic generation, or SHG) of neodymium (Nd)-based solid-state lasers, such as Nd:$Y_3Al_5O_{12}$ (Nd:YAG) or Nd:$YVO_4$. These solid-state gain materials can be pumped by infrared semiconductor lasers (e.g., at ~808 nm or ~880 nm) and produce laser radiation at ~1064 nm wavelength. This 1064 nm radiation can then be frequency doubled into the green 532 nm wavelength using nonlinear crystals such as Potassium Titanyl Phosphate (KTP) or Lithium Triborate (LBO). A similar technique can be used to obtain the blue color, e.g. 473 nm by frequency-doubling a 946 nm solid-state laser. Furthermore, the low-cost platform can be achieved by using so-called microchip technology, where the solid-state gain chip and non-linear crystal are bonded to form a monolithic laser cavity. A microchip implementation has been proposed by Mooradian (refer to U.S. Pat. No. 5,365,539).

However, the currently available microchip lasers lack the efficiency and flexibility required in many applications. The compactness and efficiency specifications are especially important in mobile, consumer-electronics applications such as handheld, battery-operated projectors. These limitations in existing platforms are mainly due to the frequency conversion inefficiency of conventional nonlinear materials such as KTP. In order to obtain high-efficiency green color output from a KTP-based microchip laser, one has to provide a significant power margin for the fundamental Infrared laser, which imposes thermal, size, and cost limitations on the overall laser system design. Furthermore, traditional bulk nonlinear materials such as KTP are restricted as to their scope of frequency conversion. For example, KTP is used for frequency doubling into the green color but cannot be practically used for frequency doubling into the blue color, so one has to search for different nonlinear materials with their own limitations in efficiency, reliability, and cost. In addition, KTP crystals, which are widely used in low-cost green laser pointers, suffer from reliability problem called "gray-tracking," which is associated with light-induced absorption in the crystal.

Laurel (refer to U.S. Pat. No. 6,259,711) proposed that many of such limitations can be overcome by the use of periodically poled nonlinear crystals. These crystals can be engineered to provide high nonlinearity for the desired conversion wavelength. Therefore, such a laser design implemented in a microchip architecture, could address many of the restrictions associated with conventional bulk nonlinear materials.

However, embodiments of that invention suffer from significant limitations, which, to our knowledge, have prevented commercialization of this platform, and, to this day, visible wavelength microchip lasers continue to rely on bulk nonlinear materials such as KTP and $KNbO_3$, the latter material being used to produce the blue color (see, e.g., published PCT application WO 2005/036703). The origin of such limitations lies in the choice of periodically poled nonlinear crystals proposed in Laurel's invention, i.e. $KTiOPO_4$ (KTP), $LiNbO_3$ (LN), and $LiTaO_3$ (LT). These materials possess high nonlinearity and can be readily poled into periodic structures for frequency doubling. However, the practical use of these materials is very limited. Like bulk KTP, periodically poled KTP can only perform well at low power levels (a few milliwatts or possibly even tens of milliwatts in the visible) but suffers from induced absorption ("gray tracking") at higher power levels. In addition, KTP crystal production is not easily scalable to high volume quantities at low cost as is required by some applications such as consumer-electronics displays. $LiNbO_3$ and $LiTaO_3$ are scalable to high-volume production and can be readily periodically poled, but suffer from visible-light-induced degradation ("photo-refractive damage") that makes it impossible to use these crystals to produce even milliwatts of visible light without severe degradation. The photo-refractive damage can be reduced at elevated temperatures (>150° C.). However, this requires using ovens for maintaining the nonlinear crystals at a high-temperature. Such ovens are incompatible with a low-cost, efficient laser fabrication, especially in the microchip geometry. Thus, the laser designs described by Laurel, cannot be implemented in a high-power, low-cost, compact, and efficient architecture. Similarly, Brown (refer to published patent application US 2005/0063441), proposed designs for compact laser packages, which would appear to be suitable for low-cost applications. However, the Brown teaching is still centered on conventional nonlinear materials such as KTP and LBO. The possible use of PPLN (periodically poled lithium niobate) and PPKTP (periodically poled potassium titanyl phosphate) is mentioned but it is not taught how one can overcome the limitations of these crystals, especially their aforementioned reliability limitations.

It is known that congruent $LiNbO_3$ and $LiTaO_3$ suffer from photo-refractive damage due to visible light, and several ways to overcome this problem have been proposed. The high-temperature operation, mentioned above, partially solves the problem, but is not suitable for most applications. Another proposed solution is doping the congruent material during the crystal growth to suppress photo-refractive damage mechanisms. Growing bulk crystals with a high degree of stoichiometry has been proposed as another method to suppress photo-refractive damage. However, none of the prior art workers have taught a means of achieving a high output power, stable ambient-temperature-operable frequency doubled laser in the microchip architecture for producing high-efficiency green and blue light in a low-cost design suitable for mass manufacturing.

Recently, several approaches were proposed to overcome reliability constraints for visible laser sources based on periodically poled materials. In particular, the use of periodically poled lithium niobate and lithium tantalate using materials with MgO, ZnO, or other dopants to overcome reliability problems was suggested. However, most of architectures for such visible laser sources were not simple enough as compared with the simple microchip architecture.

In particular, Corning, Inc. (refer to US patent application by Bhatia et al., 2008/0089373) proposed to use the nonlinear waveguide geometry, based on MgO-doped periodically poled lithium niobate to efficiently frequency double a near-infrared semiconductor laser. However, this architecture is quite expensive since it relies on the use of high-cost components (special "DBR" semiconductor laser with phase control, waveguide as opposed to bulk periodically poled MgO-doped material), and the high-cost alignment steps including sub-micron alignment of two single-mode optical waveguides, which have to be kept in alignment over the lifetime of the laser source.

Osram Semiconductors (refer to US patent application by Kuehnelt et al., US2007/0081564) proposed to use periodically poled, MgO-doped lithium niobate for intracavity frequency doubling of an optically pumped, surface-emitting semiconductor laser. While it eliminates stringent tolerances associated with single-mode waveguides, this architecture is still at significant disadvantage as compared to the microchip architecture due to its rather low optical gain (and thus limited overall efficiency) and the need to assemble and align multiple discrete optical components.

In short, known technical approaches cannot provide a reliable, cost-effective, and compact frequency-converted laser for high-efficiency visible (in particular, green-color) output.

SUMMARY OF THE INVENTION

The present invention describes a low-cost, efficient microchip laser source that produces visible-light radiation, based on nonlinear frequency conversion in periodically poled MgO-doped lithium niobate crystals. The high efficiency and high reliability of the visible laser source are achieved via using highly efficient solid-state gain crystal and by using highly efficient periodically poled MgO-doped, ZnO-doped, or stoichiometric lithium niobate ($LiNbO_3$) or lithium tantalate ($LiTaO_3$) crystal for intracavity frequency doubling. The low cost is achieved by the monolithic microchip cavity architecture that is alignment free. The microchip architecture is enabled by the thick (preferably, thicker than 0.5 mm) periodically poled MgO-doped lithium niobate crystal that provides sufficient surface area to establish robust monolithic bond with the gain crystal.

In selecting the highest efficiency nonlinear material, we have found that if periodically poled $LiNbO_3$ or $LiTaO_3$ crystals are within 0.05% of stoichiometric (quasi-stoichiometric) they do not require any dopant to be stable at high visible-wavelength output powers of up to several Watts. For crystals that are within 0.6% of stoichiometric, doping with from about 0.1 to about 1.8 mole % of ZnO or MgO achieves substantially the same beneficial results as are obtained with stoichiometric, periodically poled $LiNbO_3$ or $LiTaO_3$ crystals. Furthermore, for congruently grown $LiNbO_3$ or $LiTaO_3$ crystals, doping with MgO or ZnO from about 4 to about 7 mole % also results in materials that have high resistance to light-induced damage.

The present invention teaches a compact, efficient, and low-cost frequency-converted laser based on periodically poled materials that contain as dopants MgO or ZnO and/or have a specified degree of stoichiometry that ensures high reliability for these materials. ZnO or MgO-doped $LiNbO_3$ and $LiTaO_3$ are very different materials from their congruent undoped counterparts and their altered ferroelectric properties make these materials exceedingly difficult to pole into the short-periods, several-micron-length domains required for frequency conversion into the visible spectral range.

The technological challenges in producing periodically poled ZnO or MgO-doped and stoichiometric $LiNbO_3$ and $LiTaO_3$ have been overcome and these materials can be feasibly manufactured. Crystals with poling periods suitable for laser conversion into blue, green, and longer wavelength ranges have been produced and the technology for such production process is described in U.S. Pat. No. 7,413,635 to S. Essaian, assigned to Spectralus Corporation, the content of which is incorporated herein by reference, in its entirety, for all purposes.

The present invention solves the problem of providing a reliable, cost-effective, and compact frequency converted laser. A low-cost, efficient, and reliable solid-state laser architecture is disclosed that is based on periodically poled $LiNbO_3$ or $LiTaO_3$ that contain dopants such as MgO or ZnO and/or have a specified degree of stoichiometry that ensures high reliability for these materials.

The present invention also describes a compact, efficient, reliable, and low-cost solid-state laser, frequency-converted into wavelength ranges, not easily available through direct semiconductor lasers, i.e. into the blue, green, yellow, orange, and red wavelength regions, i.e., into wavelengths of about 450 nm to 630 nm.

The present invention teaches a method of manufacturing compact and efficient visible laser sources having output power levels of at least several tens of milliwatts and high wall-plug efficiencies exceeding 10%, which levels are not easily achievable with existing technologies.

One aspect of the present invention is a solid-state microchip laser source providing a frequency doubled visible output beam with a constrained frequency spectrum. The solid-state microchip laser has a semiconductor diode pump laser providing a pump beam at a selected wavelength, and a monolithic microchip laser cavity assembly disposed to receive the pump beam. The laser cavity assembly includes two mirrors, a solid-state gain element, and a bulk periodically poled nonlinear frequency doubling crystal. Each of the mirrors is defined by a coated surface. The solid-state gain element is pumped by the semiconductor diode pump laser and disposed between the two mirrors. The bulk, periodically poled nonlinear frequency doubling crystal is also disposed between the two mirrors, and is formed of periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, or periodically poled stoichiometric $LiTaO_3$. The microchip laser cavity assembly is formed by a monolithic bonding of the gain element and the nonlinear frequency doubling crystal, and the two mirrors are provided by optical coatings on end surfaces of the gain element and the nonlinear frequency doubling crystal. Directions of the crystallographic axes of the gain element and the nonlinear frequency doubling crystal are optionally non-aligned with one another, and the length of the gain element, length of the nonlinear frequency doubling crystal, and angle between the crystallographic axes are optionally selected to form a birefringent spectral selection mechanism in the microchip laser cavity assembly to constrain frequency spectrum of the output beam within a spectral acceptance bandwidth of the nonlinear frequency doubling crystal.

Another aspect of the present invention is a solid-state microchip laser source providing a frequency doubled visible output beam, and having mechanical rigidity provided by supporting plates. The solid-state microchip laser has a semiconductor diode pump laser providing a pump beam at a selected wavelength, and a microchip laser cavity assembly disposed to receive the pump beam. The laser cavity assembly includes two mirrors, a solid-state gain element, and a bulk periodically poled nonlinear frequency doubling crystal. Each of the mirrors is defined by a coated surface. The solid-state gain element is pumped by the semiconductor diode pump laser and disposed between the two mirrors. The bulk, periodically poled nonlinear frequency doubling crystal is also disposed between the two mirrors, and is formed of periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, or periodically poled stoichiometric $LiTaO_3$. The microchip laser cavity assembly is formed by a monolithic bonding of the gain element and the nonlinear frequency doubling crystal, and the two mirrors are provided by optical coatings on end surfaces of the gain element and the nonlinear frequency doubling crystal. Supporting plates are fixedly attached to side surfaces of the monolithically bonded gain element and nonlinear frequency doubling crystal to provide mechanical rigidity for the microchip laser cavity assembly. These plates can also be used for efficient heat removal from the microchip gain element. For this purpose, high-thermal conductivity materials such as silicon or sapphire can be used for the supporting plates.

Yet another aspect of the present invention is a solid-state microchip laser source providing a frequency doubled visible output beam using a nonlinear crystal with periodic poling or perturbed-periodic poling that allows controlling temperature, wavelength, and angular tolerances. The solid-state microchip laser has a semiconductor diode pump laser providing a pump beam at a selected wavelength, and a microchip laser cavity assembly disposed to receive the pump beam. The laser cavity assembly includes two mirrors, a solid-state gain element, and a bulk periodically poled nonlinear frequency doubling crystal. Each of the mirrors is defined by a coated surface. The solid-state gain element is pumped by the semiconductor diode pump laser and disposed between the two mirrors. The bulk, periodically poled nonlinear frequency doubling crystal is also disposed between the two mirrors, and is formed of periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, or periodically poled stoichiometric $LiTaO_3$. The microchip laser cavity assembly is formed by a monolithic bonding of the gain element and the nonlinear frequency doubling crystal, and the two mirrors are provided by optical coatings on end surfaces of the gain element and the nonlinear frequency doubling crystal. The nonlinear frequency doubling crystal can be periodically poled at regular intervals or can have a periodicity of poling that is perturbed in order to achieve better tolerances in nonlinear conversion process. For the purposes of this disclosure, it is understood that everywhere "periodically poled" designation is used, it is allowable to use "quasi-periodic" or perturbed-periodic poling that allows controlling the temperature, wavelength, and angular tolerances of the nonlinear frequency conversion process.

Still another aspect of the present invention is a packaged laser device providing a visible output beam. The packaged laser device has a semiconductor diode pump laser, a microchip laser cavity assembly, an optical bench platform, a package having an output aperture, and leads for electrical connections. The semiconductor diode pump laser provides a pump beam at a selected wavelength. The output wavelength of the pump diode may be stabilized by an internal or external grating in order to achieve better pumping efficiency and better control the desired output wavelength and spectrum for the pump diode. The microchip laser cavity assembly is disposed to receive the pump beam, and includes two mirrors, a solid-state gain element, and a bulk periodically poled nonlinear frequency doubling crystal. Each of the mirrors is defined by a coated surface. The solid-state gain element is pumped by the semiconductor diode pump laser and disposed between the two mirrors. The bulk, periodically poled nonlinear frequency doubling crystal is also disposed between the two mirrors, and is formed of periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, or periodically poled stoichiometric $LiTaO_3$. The semiconductor diode pump laser and the nonlinear frequency doubling crystal are integrated on the optical bench platform. (According to alternate embodiments, other integration methods such as assembly in a cylindrical-type package in circular holders are also within the scope of this invention.) The package is integrated with the optical bench and encloses and provides heat sinking for the semiconductor diode pump laser, the microchip laser cavity assembly, and the optical bench platform, and also provides electrical connections for active elements inside the package, such as the pump diode, and an optional photodiode monitor. According to an alternate, optional embodiment, the package also provides temperature control elements: a thermistor and a Peltier cooler and/or a resistive heater.

Also, an aspect of the present invention is a packaged laser device providing a visible output beam through a beam splitter output window. The packaged laser device has a semiconductor diode pump laser, a microchip laser cavity assembly, an optical bench platform, a package having an output aperture, and a beam splitter. The semiconductor diode pump laser provides a pump beam at a selected wavelength. The microchip laser cavity assembly is disposed to receive the pump beam, and includes two mirrors, a solid-state gain element, and a bulk periodically poled nonlinear frequency doubling crystal. Each of the mirrors is defined by a coated surface. The solid-state gain element is pumped by the semiconductor diode pump laser and disposed between the two mirrors. The bulk, periodically poled nonlinear frequency doubling crystal is also disposed between the two mirrors, and is formed of periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, or periodically poled stoichiometric $LiTaO_3$. The semiconductor diode pump laser and the nonlinear frequency doubling crystal are integrated on the optical bench platform. The package is integrated with the optical bench and encloses and provides heat sinking for the semiconductor diode pump laser, the microchip laser cavity assembly, and the optical bench platform. The beam splitter is disposed in the output beam path at the output aperture and is fixedly integrated with the package. The beam splitter functions to split a small fraction of the output beam to strike a power monitor. According to one embodiment, the beam splitter is integrated as an output window covering the output aperture.

DETAILED DESCRIPTION OF THE INVENTION

Figure 1:
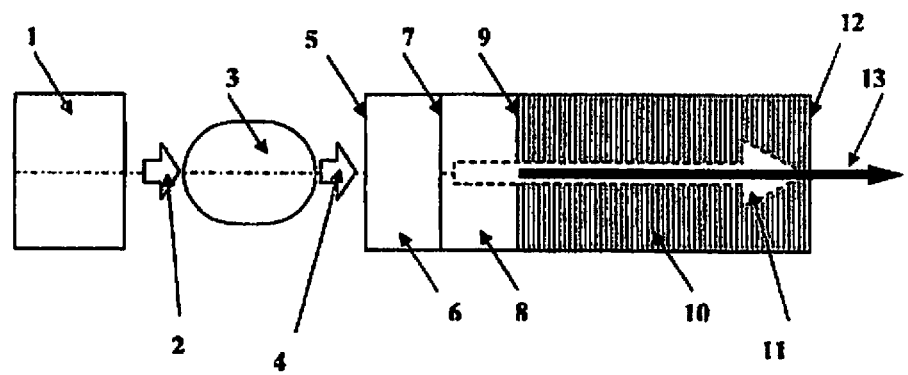
FIG. 1 shows a micro-chip laser source embodiment of the present invention.

FIG. 1 illustrates a micro-chip laser source embodiment of the present invention. The pump diode laser 1, emits a beam 2, for example, at a wavelength between 800 and 900 nm, such as ~808 nm or ~885 nm, for efficient absorption by the gain material (element) 8. The beam 2 is usually astigmatic, in which case beam-shaping optics 3 are advantageously used to convert the pump beam 2 into the beam 4 so that the beam 4 forms a cross-section of the desired size and shape (i.e., with vertical and horizontal beam dimensions being approximately equal) on the surface 7 of gain medium 8. This type of pumping arrangement is known in the art and can efficiently overlap the pump area in the gain element with the Intracavity circulating beam, which must be a single-spatial mode (or $TEM_{00}$) for efficient nonlinear frequency doubling. A suitable diameter for the pump spot on the gain element 8 is in the range of about 20 to 300 microns, and a particularly suitable diameter is in the range of about 40 to 80 microns. The beam-shaping optics can be a micro-lens, a gradient-index lens, or a combination of such optical elements. In applications requiring ultra-compact laser sources, such as "pico-projectors," the overall size of the laser source is of increased importance and the beam-shaping optics 3 can be eliminated. Optionally, the assembly includes a volume Bragg grating used to narrow down the spectral emission of the diode laser 1. Narrowing down the spectral output of the pump laser is beneficial for the efficiency of the laser system since it helps to create controlled pump volume without significant variations in absorption depth and resulting variations in thermal lensing. Other varieties of gratings are also useful for this purpose, including the gratings integrated in the pump diode laser 1.

Producing high laser source efficiency is one benefit of the present invention. To maximize efficiency and improve heat removal from the pumped gain element, we use a substantially transparent optical material 6, which has a high thermal conductivity such as sapphire, undoped $YVO_4$, or undoped $Y_3Al_5O_{12}$ (YAG). Thus, the support element 6 is bonded to the gain element 8 and acts as a heat sink. The surfaces 5, 7 of the gain element 8 are coated for high transmission at the pump laser wavelength, e.g., 808 nm. The coating of one surface 7 also provides high reflectivity at the fundamental laser wavelength, such as 1064 nm, and serves as the first mirror of the solid-state laser cavity. Some examples of optically transparent heat sink material suitable for use as the support element 6 include sapphire, undoped $YVO_4$, and undoped YAG. Of these elements, sapphire is the most efficient for heat sinking due to its high thermal conductivity and good thermal expansion match to $Nd:YVO_4$. In lower-power embodiments of the laser source (<1 W of absorbed pump power), traditional heat sinking methods to remove the heat generated by absorbed pump power, such as mounting the gain element on a copper or another high-thermal-conductivity mount, are acceptable and are within the scope of this invention. Also, refer to FIG. 3, which is described below, for disclosure of another way to improve efficiency and heat removal from the microchip assembly. Use of the support element 6 is not strictly required to practice the present invention and is disclosed to illustrate an optional mode of practice that serves to improve efficiency.

The gain medium 8 is preferably a Nd-doped element with a higher gain in one axis, such as $Nd:YVO_4$, $Nd:GdVO_4$, or $Nd:YGdVO_4$ so that the gain element 8 provides both gain and polarization control for the laser cavity. The level of Nd doping for maximizing laser efficiency in this invention will typically be in the range of about 0.5% atm to 4% atm (atomic percent). The gain element 8 also provides the transverse mode control in the otherwise flat-flat laser cavity through gain-guiding and thermal lensing effects.

An aspect of forming the gain element 8 using a crystal that has a larger gain along one of its crystalline axes than along its other crystalline axes is polarization discrimination. This serves to fulfill a technical goal of making an efficient nonlinear conversion into the visible range, specifically green wavelengths. The nonlinear process of second-harmonic generation (SHG) tends to be polarization sensitive. Thus, it is useful to select a gain crystal that has polarization discrimination.

The nonlinear crystal 10 is a periodically poled nonlinear crystal that belongs to the family of doped or stoichiometric nonlinear materials that ensure reliable crystal operation at both fundamental wavelength (namely, near-infrared) and at the second-harmonic wavelength (typically, visible). Specifically, these materials comprise PPMgOLN (periodically poled MgO-doped congruent $LiNbO_3$), PPMgOLT (periodically poled MgO-doped congruent LiTaO₃), PPZnOLN (periodically poled ZnO-doped congruent LiNbO₃), PPZnOLT (periodically poled ZnO-doped congruent LiTaO₃), PPSLN (periodically poled stoichiometric lithium niobate) or PPSLT (periodically poled stoichiometric lithium tantalate) The levels of doping and stoichiometry are selected to suppress optical degradation effects such as photo-refractive damage and visible-light-induced infrared absorption (also known as GRIIRA for green light and BLIIRA for blue light). Methods for mass manufacturing such periodically poled crystals are described by S. Essaian, one of the co-inventors of the present invention, in the U.S. Pat. No. 7,413,635, commonly assigned as the present application.

The poling period of the nonlinear crystal 10 is chosen to maximize the efficiency of the second-harmonic generation of the fundamental beam. For example, the poling period of PPMgOLN for frequency doubling of 1064 nm into 532 nm is approximately 6.95 micron. The effective nonlinear coefficient for such a material is about 16 pm/V, i.e. very high. The high nonlinearity and high reliability of the nonlinear crystals are very useful advantages of the laser system of the present invention. Since the efficiency of nonlinear conversion scales with the square of the nonlinear coefficient, the use of such materials as PPMgOLN instead of traditional materials such as KTP (with ~3.5 pm/V for conversion into the green wavelength) or LBO (~1 pm/V nonlinear coefficient) allows constructing more compact, less power consuming, and higher power output systems than traditional bulk materials allow. As a result of the high efficiency of nonlinear crystals used in embodiments of the present invention (such materials as PPMgOLN), short length of the green/blue laser microchip (and the corresponding short laser cavity) is a realistic design achievement. This microchip laser design allows large longitudinal mode spacing and has the tendency to generate single frequency radiation, which is needed for many instrumentation applications. For example, length of a green laser microchip according to embodiments of the present invention can meet a requirement of less than 1 mm.

The use of optimal doping and stoichiometry for high reliability allows making reliable laser products without the need of expensive and space-consuming ovens to heat the nonlinear crystal to suppress its optical degradation. Finally, mass manufacturability of PPMgOLN and the other crystals useful in the practice of the present invention allows achieving mass production of compact visible lasers for high-volume consumer-electronics markets. It is important to point out that colors not obtainable using commercially practicable direct semiconductor diode lasers (in particular, green color) can thus be achieved.

Using nonlinear crystals with non-periodic (chirped) or non-parallel (fan-out) poling patterns is also within the scope of the present invention. An advantage provided by the high efficiency of the materials of the present invention such as PPMgOLN is that they provide design headroom. This means that the effective nonlinearity can be traded off for other parameters such a temperature or angular acceptance bandwidth for second-harmonic generation without significant penalty in generated second harmonic power. The reason is that the intracavity second harmonic generation is limited by the maximum amount of power the laser can emit at the fundamental wavelength. Thus, a periodically poled crystal need not be strictly periodic through its entire bulk, and may indeed have a portion that is without a poling structure, periodic or otherwise.

In intracavity second-harmonic generation, the maximum second-harmonic (frequency converted) power Is limited by the maximum fundamental-frequency power the laser can produce with optimum mirror outcoupling. After the laser limitation is reached, increasing crystal nonlinearity, length, or beam focusing can achieve no further increase in second harmonic power. While conventional bulk nonlinear crystals rarely reach this regime in continuous wave laser operation, the high-nonlinearity periodically poled crystals of the present invention do reach it. As a result, this allows one to reduce laser cost and improve performance by decreasing nonlinear crystal length, modifying the poling pattern, and, especially, by using a low-cost, monolithic microchip laser cavity assembly which provides some efficiency limitations due to its inherent thermal gradients, even when the entire assembly is controlled as a whole.

Thus, in a preferred embodiment, nonlinear crystal 10 is bonded to laser gain element 8, e.g. by optical contact. The input surface 9 of the nonlinear crystal has a coating and optically fine-polished to ensure high transmission at the fundamental wavelength and high reflection at the second harmonic wavelength. This arrangement also prevents the generated visible light from entering the pump diode laser, which can be detrimental to the laser operation. It should be noted that glue(epoxy)-free bonding, which is preferred in the present invention, has seen significant progress recently, and, therefore, the monolithic assemblies disclosed here can be readily manufactured.

The output surface 12 of the nonlinear crystal serves as the second mirror of the cavity. Therefore, it is preferably coated for high reflection at the fundamental laser wavelength and for high transmission at the second-harmonic wavelength. The longitudinal and lateral dimensions of the described arrangement are optimized for high efficiency as is known in the art of laser design. We have found that the nonlinear crystal length need not exceed about 1-2 mm to obtain hundreds of milliwatts of power at the 532 nm (green color) wavelength. The optical beam 11 indicates the intracavity laser beam at the fundamental wavelength. The beam illustrates the cavity mode propagating in the direction away from gain element 8. The backward-propagating cavity mode overlaps this forward-propagating beam and, therefore, is not shown. Similarly, second-harmonic beams are generated in both the forward and backward directions. The backward-generated second-harmonic beam is reflected by the optical surface 9 and is recombined with the forward-generated second-harmonic beam so that a single beam 13 exits the laser cavity.

It should be noted that because both forward- and backward-generated second harmonic beams are coherent (i.e., have a definite phase relationship) with each other, they could optically interfere with each other, somewhat reducing the efficiency of nonlinear conversion. One method is to control this effect is via controlling the crystal temperature (the optimum point between maximizing interference to make it as close to constructive interference as possible and maximizing nonlinear conversion efficiency. Suitable temperatures range from about 20° C. to about 80° C. and can be easily achieved with the aid of a low-cost resistive heater element.

Yet another advantage for the microchip assembly of the present Invention is being able to use periodically poled crystals that are thick enough to be handled easily and be bonded to other crystals. Until recently, the commonly accepted opinion was that such materials as PPMgOLN can at best only be poled in thin wafers (0.5 mm thick or less) for conversion into blue-green colors and not really be poled at all in a production, non-research environment. Now, by using the method described by S. Essalan in the U.S. Pat. No. 7,413,635 (which patent and the present application are commonly assigned), it is possible to manufacture crystals as thick as 1 mm in high yield. The thickness is very useful for establishing the robust optical contact since it provides sufficient contact area for the bonded surfaces. Until recently, only 0.5 mm PPMgOLN crystals were commercially available for visible light nonlinear conversion applications. The thicker crystals provide a significant advantage for building a microchip laser. Thus, by using this recent achievement in crystal technology, one can obtain a monolithic microchip laser platform that surpasses existing platforms in its capabilities: i.e., power, efficiency, reliability, and cost.

Figure 2:
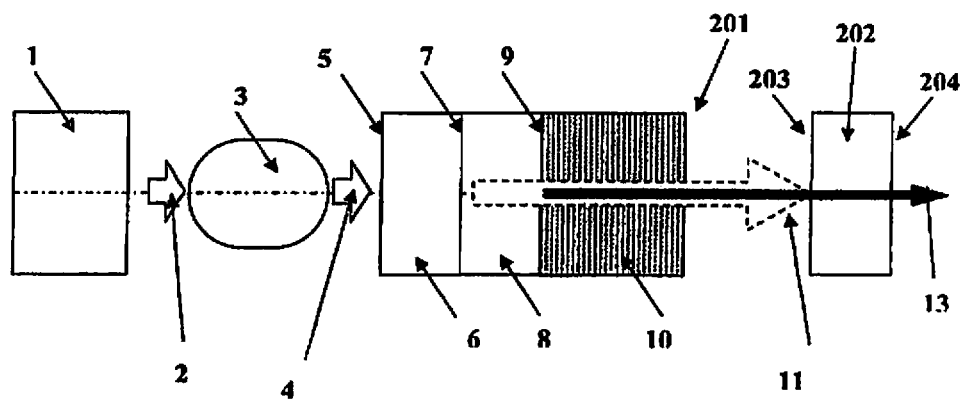
FIG. 2 shows an embodiment of the present invention with a separate mirror on either side of the cavity for spectral or spatial mode control.

Referring to FIG. 2, an embodiment of the present invention with a separate mirror for the microchip laser cavity is illustrated. Having a non-monolithic, separate-mirror assembly can be justified in some instances while keeping the efficiency advantage provided by periodically poled nonlinear materials.

In one instance, the mirror can play a role as a frequency control element. This can be useful in instances when the emission of the solid-state laser has to be constrained within a desired frequency range, for example the frequency (wavelength) range matching the acceptance bandwidth of the nonlinear crystal, or to establish single-longitudinal mode operation of the laser (for applications requiring low noise). A suitable frequency selective mirror 202 can be a volume Bragg grating. Such gratings are manufactured by such companies as Optigrate, PD-LD, and Ondax, and have previously been used to control the emission spectrum of semiconductor lasers.

In another instance, the mirror can play a role as a spatial mode control element. This is traditionally done with curved mirrors as known in the art of laser design and is also within the scope of this invention (i.e. the mirror 202 in FIG. 2 can be a curved mirror made of optical glass). The inner surface 203 of the mirror 202 may be curved with the radius of curvature selected to establish a desired lasing mode profile in the cavity. The surface 203 is usually coated for high reflectivity (HR) at the fundamental wavelength of the solid-state laser, e.g. the wavelength of 1064 nm. The outer surface 204 is usually flat and is coated for high transmission at the fundamental wavelength. Both surfaces 203 and 204 also usually have the coating specification to have high transmission at the second-harmonic wavelength, e.g. 532 nm. The outer surface 201 of the nonlinear crystal 10 is preferably coated for high transmission at both fundamental and second-harmonic wavelengths.

Figure 3:
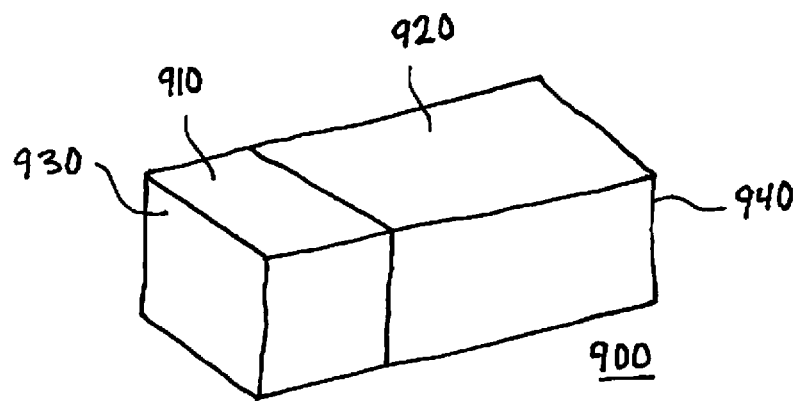
FIG. 3 shows a microchip laser cavity assembly.

Referring to FIG. 3, a microchip laser cavity assembly is illustrated. This embodiment has a solid state gain element 910 and a periodically poled nonlinear frequency doubling crystal 920, which are placed together along a propagation axis, with mirrors 930, 940 coated onto opposed ends of the combination. The gain element 910, periodically poled nonlinear frequency doubling crystal 920, and mirrors 930, 940 form a microchip laser cavity assembly 900. The mirrors 930, 940 are chosen to be reflective at the frequency of a pump (fundamental-frequency) beam (refer to FIGS. 6, 10, and 11) that is to be used for pumping the a microchip laser cavity assembly 900. The basic laser microchip architecture shown in FIG. 3 does not include the transparent heat sink (element 6 in FIGS. 1 and 2) but it is understood that both embodiments (with and without such a heat sink) are within the scope of this invention.

The periodically poled nonlinear frequency doubling crystal 920 is selected from a group of nominally periodically poled crystalline materials. Periodically poled $LiNbO_3$ (doped with either MgO or ZnO), periodically poled $LiTaO_3$ (doped with either MgO or ZnO), stoichiometric or quasi-stoichiometric periodically poled $LiNbO_3$, and stoichiometric or quasi-stoichiometric periodically poled $LiTaO_3$ are all suitable for use as this optical element.

A useful feature that can be implemented in the various embodiments is to arrange the crystallographic axes directions of the gain element 910 and the nonlinear frequency doubling crystal 920 so they are not aligned with one another, thus creating a birefringent spectral selection mechanism in the microchip laser cavity assembly to constrain the spectral output of the laser in a desired spectral window. Frequency (wavelength) filtering is desirable so that the laser operates in a frequency band that is within the acceptance bandwidth of the nonlinear second harmonic generation process. This improves efficiency of the process by suppressing lasing modes that fall outside of the acceptance bandwidth and thus cannot be frequency converted efficiently into the visible light. In this case, the gain element 910 that has a dominant gain axis acts as an intracavity polarizer that is facilitating frequency selection based on the intracavity birefringent element (here, nonlinear crystal). The angle of misalignment is selected based on the trade-off between frequency discrimination (strongest for larger angles) and the loss in nonlinear conversion efficiency due to the presence of polarization that is not participating efficiently in the nonlinear conversion process. We have found that often small angles such as ~10 degree angle between the c-axis of $Nd:YVO_4$ (gain element) and the Z-axis of PPMgOLN are sufficient for a useful trade-off (sufficient frequency discrimination with almost no penalty in efficiency).

When the total length of the microchip laser cavity assembly 900 is built to be less than about 1 mm in length, substantially single-longitudinal mode operation is well supported. Single-longitudinal mode operation is useful for low-noise instrumentation applications.

Figure 4:
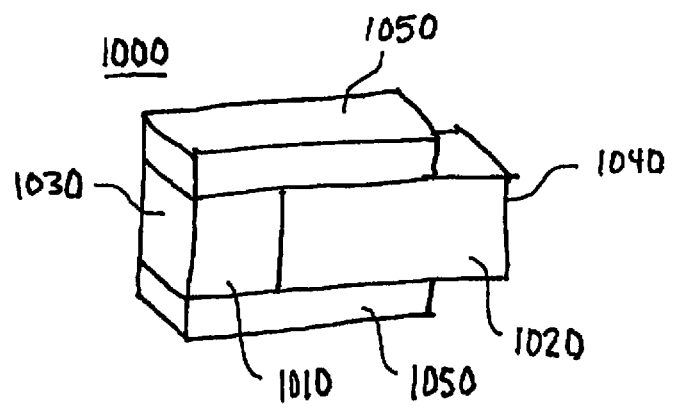
FIG. 4 shows a microchip laser cavity assembly with supporting plates.

Referring to FIG. 4, a microchip laser cavity assembly with supporting plates is illustrated. This embodiment has a solid state gain element 1010 and a periodically poled nonlinear frequency doubling crystal 1020 monolithically bonded together. Mirrors 1030, 1040 are coated onto opposed ends of the combination of the solid state gain element 1010 and the periodically poled nonlinear frequency doubling crystal 1020.

A pair of supporting plates 1050 are fixedly attached to opposed side surfaces of the monolithically bonded gain element 1010 and nonlinear frequency doubling crystal 1020 to provide mechanical rigidity for the microchip laser cavity assembly 1000. Although only two plates 1050 are shown in the illustrated embodiment, the invention encompasses the practice of fixedly attaching a third or fourth plate to the sides of the microchip laser cavity assembly 1000. In addition to providing mechanical support, the plates enhance thermal stability. The number of plates 1050 implemented is chosen based on a desired degree of mechanical support, a desired degree of thermal stability, or both. The material for the plates 1050 is chosen to have a high-thermal-conductivity, for example, silicon.

The intra-cavity bonded optical surfaces of the gain element 1010 and the nonlinear frequency doubling crystal 1020 can optionally be left uncoated, which works well in many situations. On the other hand, in some embodiments it is not desirable for the green second harmonic beam generated in the backward direction to enter the gain element 1010, because that would tend to introduce losses and de-polarization for the second harmonic generated beam. To avoid losses, one or both of the intra-cavity bonded optical surfaces of the gain element 1010 and the nonlinear frequency doubling crystal 1020 are coated to provide high reflectance for the frequency doubled beam. To avoid de-polarization, one or both of the intra-cavity bonded optical surfaces are coated to prevent the change of polarization state of the frequency doubled beam entering the gain crystal to ensure a linearly polarized output.

Figure 5:
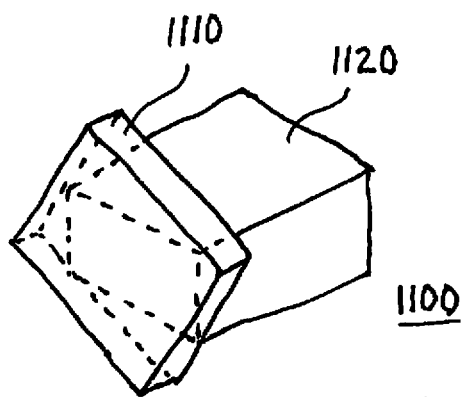
FIG. 5 shows a microchip laser cavity assembly with different cross-section dimensions for the solid-state gain crystal and the periodically poled nonlinear crystal.

Referring to FIG. 5, a microchip laser cavity assembly 1100 according to an alternate embodiment is illustrated. This assembly 1100 has different cross-section dimensions for the solid-state gain crystal 1110 and the periodically poled non-linear crystal 1120. Practice of the present invention is not limited to assemblies where the gain crystal and nonlinear crystal have like dimensions. This geometry also serves as an illustration for the design that has crystallographic axes of the solid-state gain crystal 1110 and the periodically poled non-linear crystal 1120 not aligned with one another. For example, the crystallographic axes may be aligned to the edges of the crystals shown in FIG. 4.

Figure 6:
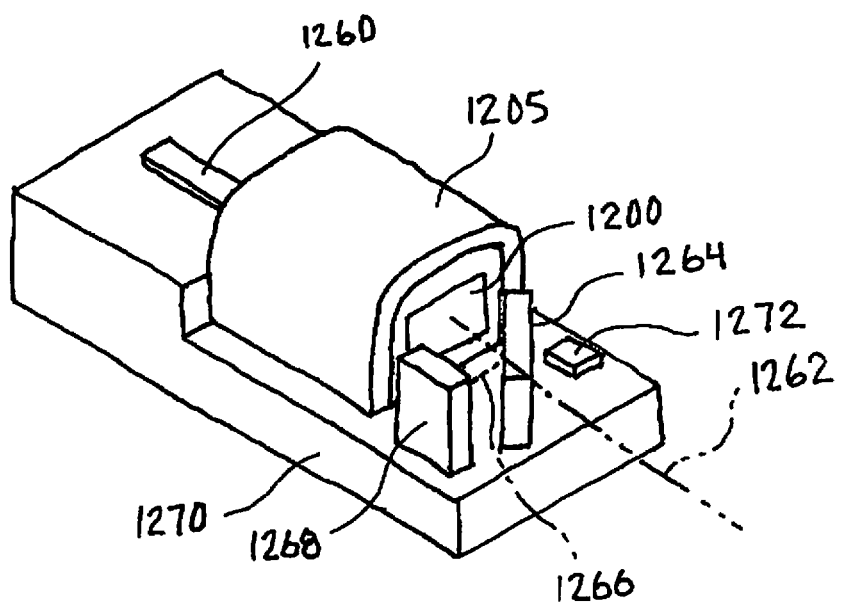
FIG. 6 shows a visible microchip laser source assembled on a common platform.

Referring to FIG. 6, a visible microchip laser source assembled on a common platform is illustrated. A microchip laser cavity assembly 1200 is pumped by a pumping laser diode 1260 and the output beam emerges along a beam axis 1262 that projects through a beam splitter 1264. A portion of the output beam is split by the beam splitter 1264 to project along a secondary axis 1266 to a power monitor 1268. The microchip laser cavity assembly 1200, pumping laser diode 1260, beam splitter 1264, and power monitor 1268 are all fixedly mounted onto a common optical bench platform 1270. A thermistor 1272 is also fixedly mounted on the optical bench platform 1270 to provide temperature sensing for thermal control.

In this embodiment, the microchip laser cavity assembly 1200 is shown as being placed under a cover 1205 with good heat conduction properties. The illustrated cover 1205 is optional and not necessary for practice of the present invention.

The illustrated optical bench platform 1270 is advantageously formed from a metal, an alloy, or another material with high thermal conductivity. Examples of suitable materials for the optical bench platform 1270 are copper, copper tungsten, or nickel-cobalt ferrous alloy. A common type of nickel-cobalt ferrous alloy that is suitable for practice of the invention is sold under the trademark Kovar®. Some non-metals are also practicable for forming the optical bench platform 1270, so long as the non-metal material selected has high thermal conductivity. Suitable materials are silicon, aluminum nitride, and some others.

Figure 7:
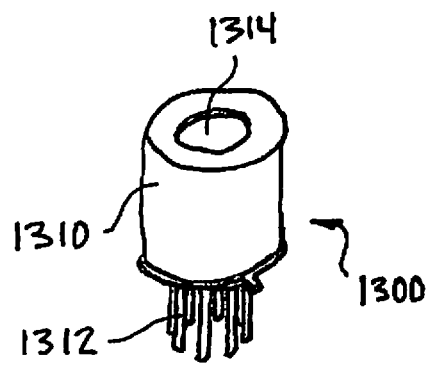
FIG. 7 shows a perspective view of a packaged laser source product implementing a microchip laser cavity assembly and having a cylindrical package with axially oriented electrical connections.

Referring to FIG. 7, a packaged laser source product 1300 implementing a microchip laser cavity assembly and having a cylindrical package 1310 with axially oriented electrical leads 1312 is illustrated. A portal 1314 at one end of the cylindrical package 1310 allows egress of an output laser beam. Advantageously, the overall package is hermetically sealed and is formed of metal, ceramic, or a combination thereof. However, hermetically sealing the package is not strictly required to practice the invention, and there are implementations (such as exposure to high vacuum or high pressure) when such a seal would best be avoided. The package integrates all laser components to provide a reliable laser enclosure, heat sinking, temperature control, electrical connections, and output aperture for the laser beam.

Figure 11:
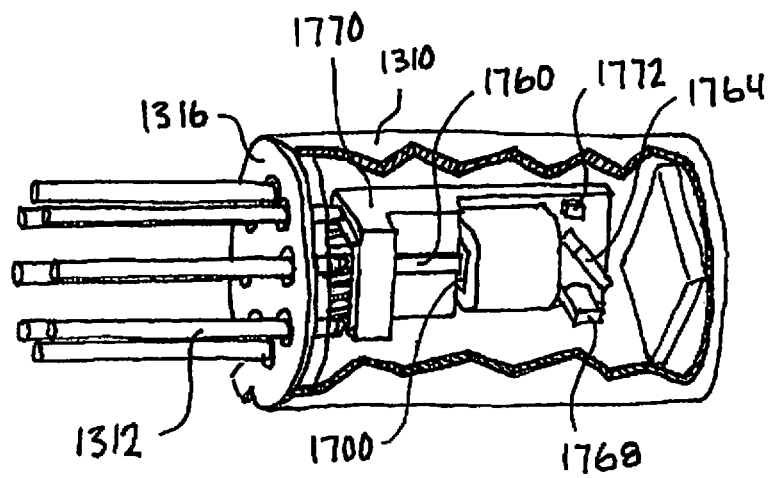
FIG. 11 shows a section view of the cylindrically packaged laser source product of FIG. 9.
Figure 13:
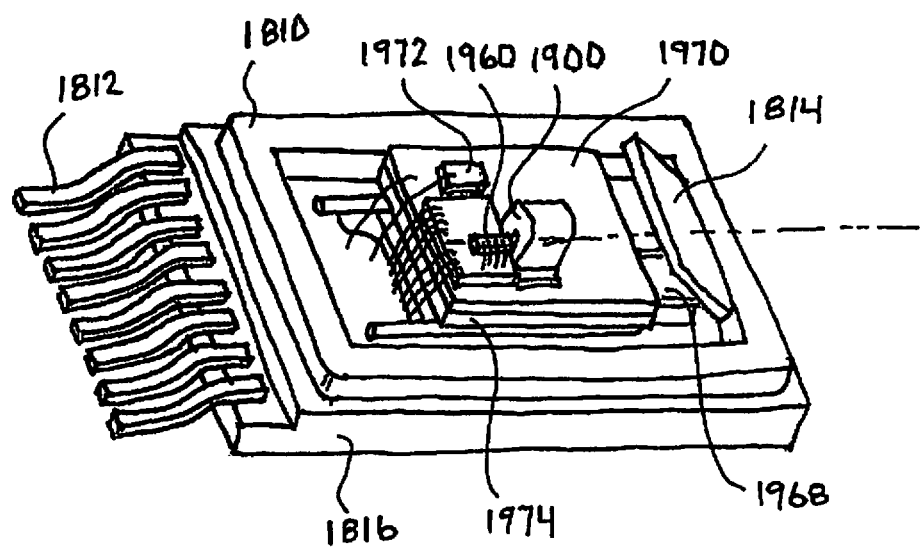
FIG. 13 shows a section view of the flat packaged laser source product of FIG. 12.

The packaged laser source product 1300 according to this embodiment is shown in partial section in FIG. 11. A microchip laser cavity assembly 1700, pumping laser diode 1760, beam splitter 1764, power monitor 1768, and a thermistor 1772 are all fixedly mounted onto a common optical bench platform 1770. The optical bench platform 1770 is in turn mechanically fixed to a base 1316 of the cylindrical package 1310. The pumping laser diode 1760, power monitor 1768, and thermistor 1772 are electrically connected to the electrical leads 1312. The beam splitter deflecting a part of the beam onto the power monitor may be combined into one element with the output window, as also illustrated in FIG. 13.

Figure 8:
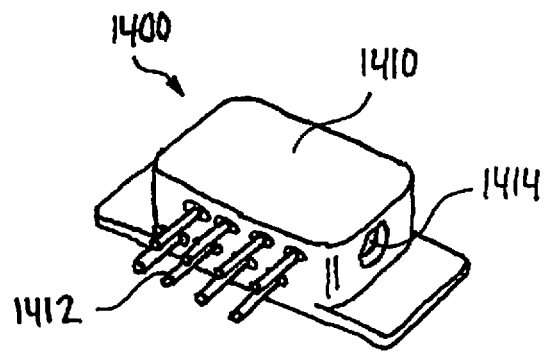
FIG. 8 shows a perspective view of a packaged laser source product implementing a microchip laser cavity assembly and having a flat package with lateral electrical connections.

Referring to FIG. 8, a packaged laser source product 1400 implementing a microchip laser cavity assembly (not shown) and having a flat package 1410 with lateral electrical leads 1412 is illustrated. A portal 1414 at one end of the flat package 1410 allows egress of an output laser beam. The microchip laser cavity assembly according to this embodiment is like those illustrated and described above with regard to FIGS. 6, 7, and 11.

Figure 9:
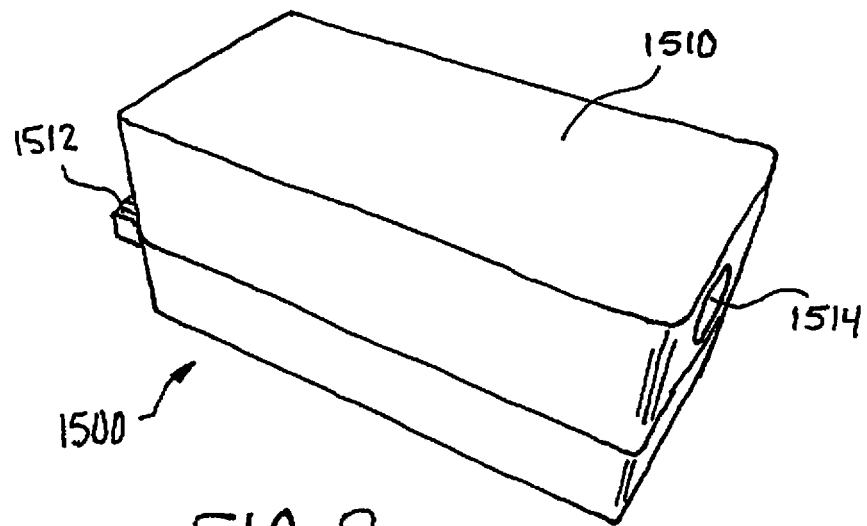
FIG. 9 shows a perspective view of a packaged laser source product implementing a microchip laser cavity assembly and having a flat package with longitudinal electrical connections.

Referring to FIG. 9, a packaged laser source product 1500 implementing a microchip laser cavity assembly and having a flat package 1510 with longitudinal electrical leads 1512 is illustrated. A portal 1514 at one end of the flat package 1510 allows egress of an output laser beam.

Figure 10:
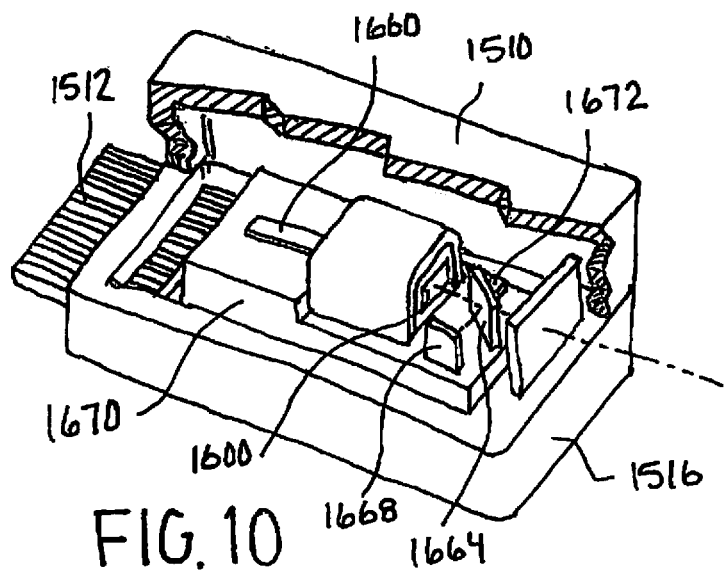
FIG. 10 shows a section view of the flat packaged laser source product of FIG. 9.

The packaged laser source product 1500 according to this embodiment is shown in partial section in FIG. 10. A microchip laser cavity assembly 1600, pumping laser diode 1660, beam splitter 1664, power monitor 1668, and a thermistor 1672 are all fixedly mounted onto a common optical bench platform 1670. The optical bench platform 1670 is in turn mechanically fixed to a base 1516 of the flat package 1510. The pumping laser diode 1660, power monitor 1668, and thermistor 1672 are electrically connected to the electrical leads 1512.

Figure 12:
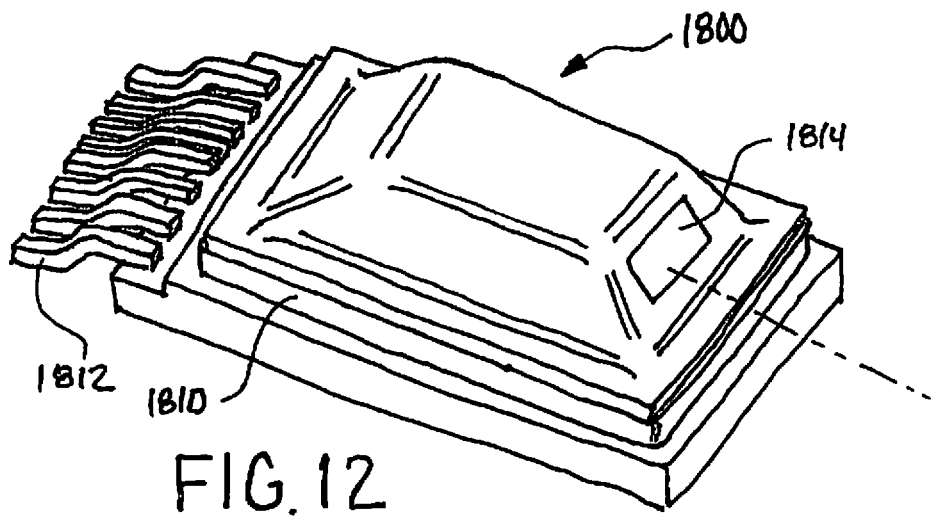
FIG. 12 shows a perspective view of the packaged laser source product implementing a microchip laser cavity assembly and having a flat package implementing an integral beam splitter output window.

Referring to FIG. 12, a flat package embodiment is illustrated implementing an integral beam splitter output window in a packaged laser source product 1800 implementing a microchip laser cavity assembly. The packaged laser source product 1800 has a flat package 1810 with longitudinal electrical leads 1812 and an integral beam splitter output window 1814.

The window 1814 may be optically transparent at both infrared and visible wavelengths and its one or both surfaces may be coated to transmit most of the visible light output, block the infrared light (at the pump diode wavelength and the fundamental wavelength of the microchip laser cavity), and deflect a small portion of the visible light into the power monitor. Alternatively, the window 1814 may be made from a filter glass that blocks infrared light and has high transmission in the visible. Optical coatings may be applied to provide desired power ratio between the beam deflected onto the power monitor and the beam transmitted outward. Yet in another embodiment, the window 1814 may be uncoated and oriented at an angle close to the Brewster angle for the visible output beam so that the cost of the part is lowered and desired power splitting is achieved with an uncoated surface. Depending on the selected polarization of the output beam, the window may be oriented, as shown in FIG. 12, for the vertical polarization or tilted in another plane for the horizontal polarization.

The packaged laser source product 1800 according to this embodiment is shown in partial section in FIG. 13. A microchip laser cavity assembly 1900, pumping laser diode 1960, beam splitter 1964, power monitor 1968, and a thermistor 1972 are all fixedly mounted onto a common optical bench platform 1970. The optical bench platform 1970 is fixed atop a temperature controlled plate 1974, which is in turn mechanically fixed to a base 1816 of the flat package 1810 so as to provide good thermal conduction from the temperature controlled plate 1974 to the base 1816. The pumping laser diode 1960, power monitor 1968, thermistor 1972, and temperature controlled plate 1974 are electrically connected to the electrical leads 1812.

The temperature controlled plate 1974 is advantageously embodied using a thermo-electric cooler (TEC), such as a Peltier cell. Alternatively, temperature controlled plate 1974 is embodied by an electrically driven heater element. According to an alternate embodiment, the TEC element itself serves as the optical bench platform and as a base of the overall laser package to make the package very compact.

According to an optional aspect of the present invention, the semiconductor diode pump laser is embodied as a semiconductor laser chip disposed on a submount that is mounted on the optical bench platform. Alternatively, the semiconductor laser chip is mounted directly on the same optical bench platform as the microchip laser cavity assembly. According to this direct mount alternative, the optical bench also serves as the submount for the semiconductor pump laser. This direct mount configuration saves cost and assembly time by reducing the number of components and assembly steps.

According to another optional aspect of the present invention, the pump beam is directed to the gain element via beam shaping optics such as microlens or a gradient-index lens. Beam shaping optics are not necessary to practice the invention, though, and the pump beam is alternatively delivered to the gain element without use of beam shaping optics.

One aspect of the package embodiments is the output aperture having a window made of material that transmits desired visible output but blocks residual infrared light from the semiconductor pump laser diode and microchip laser cavity.

Although the electrical connections in the package embodiments have been described as being "pins," a pin form is not essential to practice of the invention. The electrical connections may also be advantageously formed as a printed circuit board or a flexible circuit board or some other type of electrical leads.

For implementation of a microchip laser integrated in a package according to the present invention, a laser driver is advantageously provided to supply electrical power and control the components that include the semiconductor laser pump diode, the thermistor, the temperature control element. The laser driver can also be embodied to utilize the power monitor for measurement and control of the device.

A suitable use for microchip lasers sources according to the present invention is as one of the primary sources in an RGB projection display system. Laser sources used in an RGB projection display system would be driven in pulsed mode for color-sequential operation with a spatial light modulator microdisplay.

A visible microchip laser source with periodically poled nonlinear materials has been described. It will be understood by those skilled in the art that the present invention may be embodied in other specific forms without departing from the scope of the invention disclosed and that the examples and embodiments described herein are in all respects illustrative and not restrictive. Those skilled in the art of the present invention will recognize that other embodiments using the concepts described herein are also possible. Further, any reference to claim elements in the singular, for example, using the articles "a," "an," or "the" is not to be construed as limiting the element to the singular.

What is claimed is:

1. A solid-state microchip laser source providing a frequency doubled visible output beam, the solid-state microchip laser comprising:
    a semiconductor diode pump laser providing a pump beam at a selected wavelength; and
    a microchip laser cavity assembly disposed to receive the pump beam, the laser cavity assembly comprising: two mirrors, each mirror defined by a coated surface, a solid-state gain element pumped by the semiconductor diode pump laser and disposed between said two mirrors, and
    a bulk, periodically poled nonlinear frequency doubling crystal disposed between the two mirrors, the crystal being selected from the group consisting of: periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, and periodically poled stoichiometric $LiTaO_3$,
    wherein the microchip laser cavity assembly is formed by a monolithic bonding of the gain element and the nonlinear frequency doubling crystal, and the two mirrors are provided by the optical coatings on end surfaces of the gain element and the nonlinear frequency doubling crystal, and
    wherein relative directions of crystallographic axes of the gain element and the nonlinear frequency doubling crystal are selected to maximize a stable and efficient output into the frequency doubled visible beam, wherein length of the gain element, length of the nonlinear frequency doubling crystal, and the angle between the crystallographic axis of the gain element and the crystallographic axis of the nonlinear frequency doubling crystal are selected to support operation in substantially a single longitudinal mode.

2. A solid-state microchip laser source providing a frequency doubled visible output beam, the solid-state microchip laser comprising:
    a semiconductor diode pump laser providing a pump beam at a selected wavelength; and
    a microchip laser cavity assembly disposed to receive the pump beam, the laser cavity assembly comprising: two mirrors, each mirror defined by a coated surface, a solid-state gain element pumped by the semiconductor diode pump laser and disposed between said two mirrors, and
    a bulk, periodically poled nonlinear frequency doubling crystal disposed between the two mirrors, the crystal being selected from the group consisting of: periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, and periodically poled stoichiometric $LiTaO_3$,
    wherein the microchip laser cavity assembly is formed by a monolithic bonding of the gain element and the nonlinear frequency doubling crystal, and the two mirrors are provided by the optical coatings on end surfaces of the gain element and the nonlinear frequency doubling crystal, and
    wherein relative directions of crystallographic axes of the gain element and the nonlinear frequency doubling crystal are selected to maximize a stable and efficient output into the frequency doubled visible beam, wherein the total length of the microchip laser cavity assembly is selected so as to support operation in substantially a single longitudinal mode.

3. The solid-state microchip laser source of claim 2, wherein the total length of the microchip laser cavity assembly is selected be less than about 1 mm.

4. A solid-state microchip laser source providing a frequency doubled visible output beam, the solid-state microchip laser comprising:
    a semiconductor diode pump laser providing a pump beam at a selected wavelength; and
    a microchip laser cavity assembly disposed to receive the pump beam, the laser cavity assembly comprising:

two mirrors, each mirror defined by a coated surface, a solid-state gain element pumped by the semiconductor diode pump laser and disposed between said two mirrors, and a bulk, periodically poled nonlinear frequency doubling crystal disposed between the two mirrors, the crystal being selected from the group consisting of: periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, and periodically poled stoichiometric $LiTaO_3$, wherein the microchip laser cavity assembly is formed by a monolithic bonding of the gain element and the nonlinear frequency doubling crystal, and the two mirrors are provided by the optical coatings on end surfaces of the gain element and the nonlinear frequency doubling crystal, and wherein relative directions of crystallographic axes of the gain element and the nonlinear frequency doubling crystal are selected to maximize a stable and efficient output into the frequency doubled visible beam, further comprising: one or more supporting plates fixedly attached to side surfaces of the monolithically bonded gain element and nonlinear frequency doubling crystal to provide mechanical rigidity for the microchip laser cavity assembly.

5. The solid-state microchip laser source of claim 4, wherein no optical beams are blocked by attachment of the supporting plates to the side surfaces of the monolithically bonded gain element and nonlinear frequency doubling crystal.

6. The solid-state microchip laser source of claim 4, wherein the supporting plates comprise a material having high thermal conductivity.

7. The solid-state microchip laser source of claim 4, wherein the diode pump laser comprises an internal grating narrowing down spectral emission of the diode pump laser.

8. A solid-state microchip laser source providing a frequency doubled visible output beam, the solid-state microchip laser comprising:

a semiconductor diode pump laser providing a pump beam at a selected wavelength; and a microchip laser cavity assembly disposed to receive the pump beam, the laser cavity assembly comprising:

two mirrors, each mirror defined by a coated surface, a solid-state gain element pumped by the semiconductor diode pump laser and disposed between said two mirrors, and a bulk, periodically poled nonlinear frequency doubling crystal disposed between the two mirrors, the crystal being selected from the group consisting of: periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, and periodically poled stoichiometric $LiTaO_3$, wherein the microchip laser cavity assembly is formed by a monolithic bonding of the gain element and the nonlinear frequency doubling crystal, and the two mirrors are provided by the optical coatings on end surfaces of the gain element and the nonlinear frequency doubling crystal, and wherein relative directions of crystallographic axes of the gain element and the nonlinear frequency doubling crystal are selected to maximize a stable and efficient output into the frequency doubled visible beam, wherein the nonlinear frequency doubling crystal has a periodicity of poling that is perturbed, wherein the nonlinear frequency doubling crystal comprises a segment without periodic poling structure.

9. A solid-state microchip laser source providing a frequency doubled visible output beam, the solid-state microchip laser comprising:

a semiconductor diode pump laser providing a pump beam at a selected wavelength; and a microchip laser cavity assembly disposed to receive the pump beam, the laser cavity assembly comprising:

two mirrors, each mirror defined by a coated surface, a solid-state gain element pumped by the semiconductor diode pump laser and disposed between said two mirrors, and a bulk, periodically poled nonlinear frequency doubling crystal disposed between the two mirrors, the crystal being selected from the group consisting of: periodically poled MgO-doped $LiNbO_3$, periodically poled MgO-doped $LiTaO_3$, periodically poled ZnO-doped $LiNbO_3$, periodically poled ZnO-doped $LiTaO_3$, periodically poled stoichiometric $LiNbO_3$, and periodically poled stoichiometric $LiTaO_3$, wherein the microchip laser cavity assembly is formed by a monolithic bonding of the gain element and the nonlinear frequency doubling crystal, and the two mirrors are provided by the optical coatings on end surfaces of the gain element and the nonlinear frequency doubling crystal, and wherein relative directions of crystallographic axes of the gain element and the nonlinear frequency doubling crystal are selected to maximize a stable and efficient output into the frequency doubled visible beam, an optical bench platform, the semiconductor diode pump laser and the nonlinear frequency doubling crystal being integrated on the optical bench platform; and a package having an output aperture for the output beam and being integrated with the optical bench, the package enclosing and providing heat sinking for the semiconductor diode pump laser, the microchip laser cavity assembly, and the optical bench platform.

10. The solid-state microchip laser source of claim 9, further comprising: a beam splitter disposed in the output beam path inside the package; and a power monitor disposed to receive a portion of the output beam split by the beam splitter; wherein the package provides electrical connections for the semiconductor diode pump laser and the power monitor.

11. The solid-state microchip laser source of claim 9, further comprising: a thermo-electric cooler in thermal communication with the optical bench platform and disposed inside the package; wherein the package provides electrical connections for the semiconductor diode pump laser and the thermo-electric cooler.

12. The solid-state microchip laser source of claim 11, wherein the package comprises a package base, and wherein the optical bench platform, the package base, and the thermo-electric cooler are integrated together as a single unitary piece.

13. The solid-state microchip laser source of claim 9, further comprising: an electrically driven heater element in thermal communication with the optical bench platform and disposed inside the package; wherein the package provides electrical connections for the semiconductor diode pump laser and the heater element.

14. The solid-state microchip laser source of claim 9, wherein the optical bench platform comprises material having high thermal conductivity.

15. The solid-state microchip laser source of claim 9, wherein the package has a base comprising ceramic material.

16. The solid-state microchip laser source of claim 9, wherein the package has a base comprising metal.

17. The solid-state microchip laser source of claim 9, wherein the output aperture has a window comprising material that transmits the output beam while blocking residual infrared light from the semiconductor diode pump laser and microchip laser cavity assembly.

18. The solid-state microchip laser source of claim 9, wherein a beam splitter disposed in the output beam path at the output aperture and fixedly integrated with the package.

* * * * *